(12) United States Patent
Chiang et al.

(10) Patent No.: US 6,757,180 B1
(45) Date of Patent: Jun. 29, 2004

(54) ELECTRONIC COMPONENT BASE

(75) Inventors: Chien Yee Chiang, Taoyuan Hsien (TW); Ming-Tung Lai, Taoyuan Hsien (TW)

(73) Assignee: Ferrico Corporation, Taoyuan Hsien (TW)

( * ) Notice: Subject to any disclaimer, the term of this patent is extended or adjusted under 35 U.S.C. 154(b) by 0 days.

(21) Appl. No.: 10/462,625

(22) Filed: Jun. 17, 2003

(30) Foreign Application Priority Data

May 13, 2003 (TW) .................................... 092208707 U

(51) Int. Cl.[7] ................................................. H05K 7/02
(52) U.S. Cl. ..................... 361/807; 361/808; 361/809; 361/811; 174/52.1
(58) Field of Search ............................. 361/807–812, 361/767, 774; 174/52.1

(56) References Cited

U.S. PATENT DOCUMENTS

| | | | | |
|---|---|---|---|---|
| 5,825,628 A | * | 10/1998 | Garbelli et al. | ............. 361/763 |
| 5,880,926 A | * | 3/1999 | Nishino et al. | ............. 361/517 |
| 6,477,046 B1 | * | 11/2002 | Stearns et al. | ............. 361/704 |
| 6,510,060 B2 | * | 1/2003 | Jakob et al. | ................ 361/807 |

* cited by examiner

Primary Examiner—David Martin
Assistant Examiner—Dameon E. Levi
(74) Attorney, Agent, or Firm—Troxell Law Office PLLC

(57) ABSTRACT

An electronic component base for an electronic component is disclosed to have a top wall adapted to accommodate an electronic component core, diagonally extended wire grooves in the top wall for guiding out lead wires of the loaded electronic component core, a bottom wall, a plurality of electrically conducting zones in the bottom wall, four peripheral walls, four chamfered angles alternatively connected between the peripheral walls, and four conducting side grooves respectively extended from the wire grooves to the electrically conducting zones for receiving the lead wires of the electronic component core from the wire grooves.

4 Claims, 5 Drawing Sheets

… (US 6,757,180 B1)

ELECTRONIC COMPONENT BASE

BACKGROUND OF THE INVENTION

1. Field of the Invention

The present invention relates to electronic components and, more specifically, to an electronic component base, which keeps the top wall smooth and maintains the size within the nominal range after soldering of the lead wires of the winding of electronic component core.

2. Description of the Related Art

Electronic apparatus are commonly operated through a circuit board. A circuit board for electronic apparatus has pre-set contacts for the connection of contact pins or lead wires of a variety of electronic components. The so-called electronic components in this regard include resistors, capacitors, inductors, and etc. Because electronic apparatus produce heat during operation, electronic components must be prohibited from contacting the circuits of the circuit board except the connection of the contact pins. An electronic component generally has a base made of ceramics for the advantages of electrically insulative and heat resisting properties. FIG. 1 shows the structure of a regular inductor. According to this design, the inductor comprises a base B, and an iron core A mounted with a winding and set in the base B. The base B has peripheral lugs C and a bottom spacer block E. The lead wires of the winding are extended from the iron core A and wound round the grooves D in the peripheral lugs C of the base B and then extended to the bottom side of the base B at two sides of the bottom spacer block E for soldering to the circuit board with tin solder. This structure of electronic component base has drawbacks. Because the base B has peripheral lugs C protruding from the periphery, the peripheral lugs C destruct the shape design of the base B. Because the lead wires of the winding are wound around the peripheral lugs C, they tend to be damaged by external objects, or may touch other electronic components during installation. Further, because the bottom spacer block E downwardly protrude from the bottom wall of the base B, it is difficult to keep the electronic component horizontally in balance when installing the electronic component in a circuit board.

FIG. 2 are top and side views of another structure of electronic component base according to the prior art. According to this design, the base has two wire grooves F at two sides relative to the circular center recess for accommodating the lead wires of the winding at the core member, and electroplated zones G for the connection of the lead wires of the winding at the core member. This design of base can be maintained in balance when installed in a circuit board. However, when the lead wires soldered to the wire grooves F, the tin solder H protrudes over the outside of the base, resulting in an uneven peripheral surface of the base (see FIG. 3).

SUMMARY OF THE INVENTION

The present invention has been accomplished under the circumstances in view. It is the main object of the present invention to provide an electronic component base, which keeps the top wall smooth and maintains the size within the nominal range after soldering of the lead wires of the winding of electronic component core. To achieve this and other objects of the present invention, the electronic component base comprises a top wall adapted to accommodate an electronic component core, a bottom wall, four peripheral walls, and four angles alternatively connected between the peripheral walls, wherein the top wall has at least one pair of diagonally extended wire grooves for guiding out lead wires of an electronic component core mounted in the top wall; the bottom wall has a plurality of electrically conducting zones corresponding to the wire grooves; the angles are chambered, each having a conducting groove respectively extended from the wire grooves to the electrically conducting zones for receiving the lead wires of the electronic component core from the wire grooves.

DETAILED DESCRIPTION OF THE PREFERRED EMBODIMENT

Figure 1:
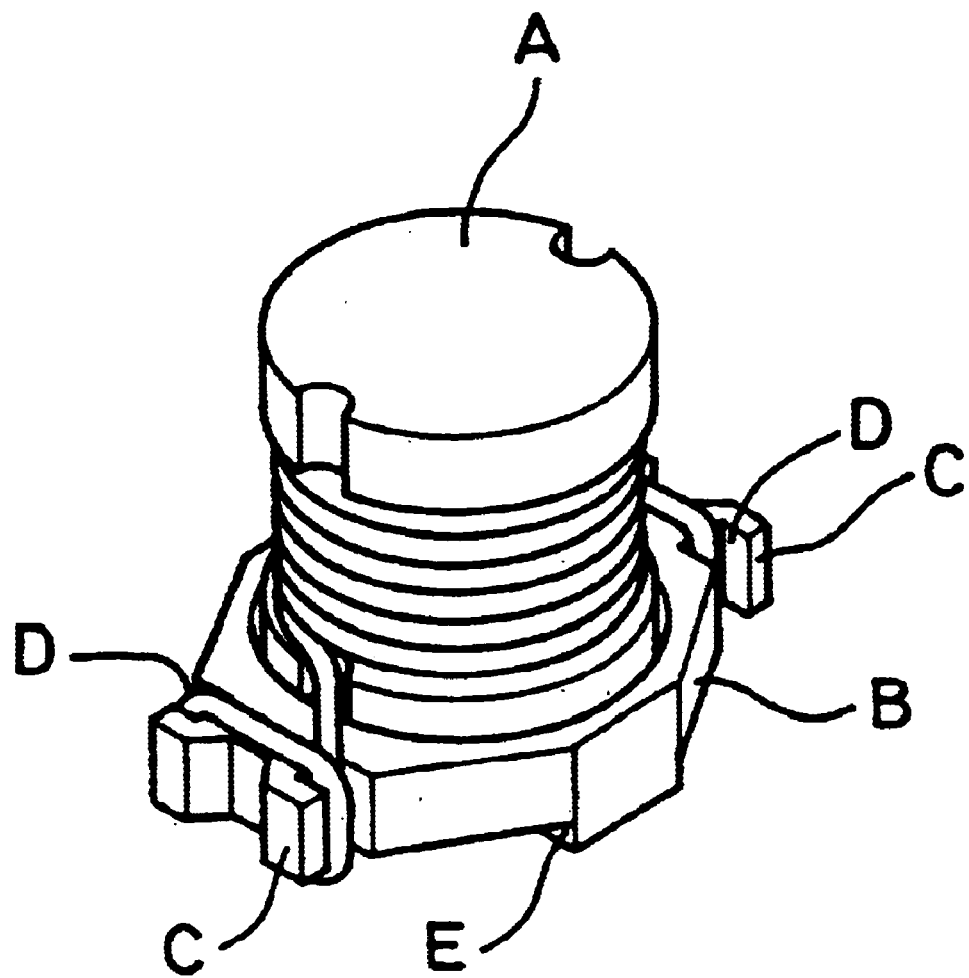
FIG. 1 is an elevational view of a conventional inductor.
Figure 2:
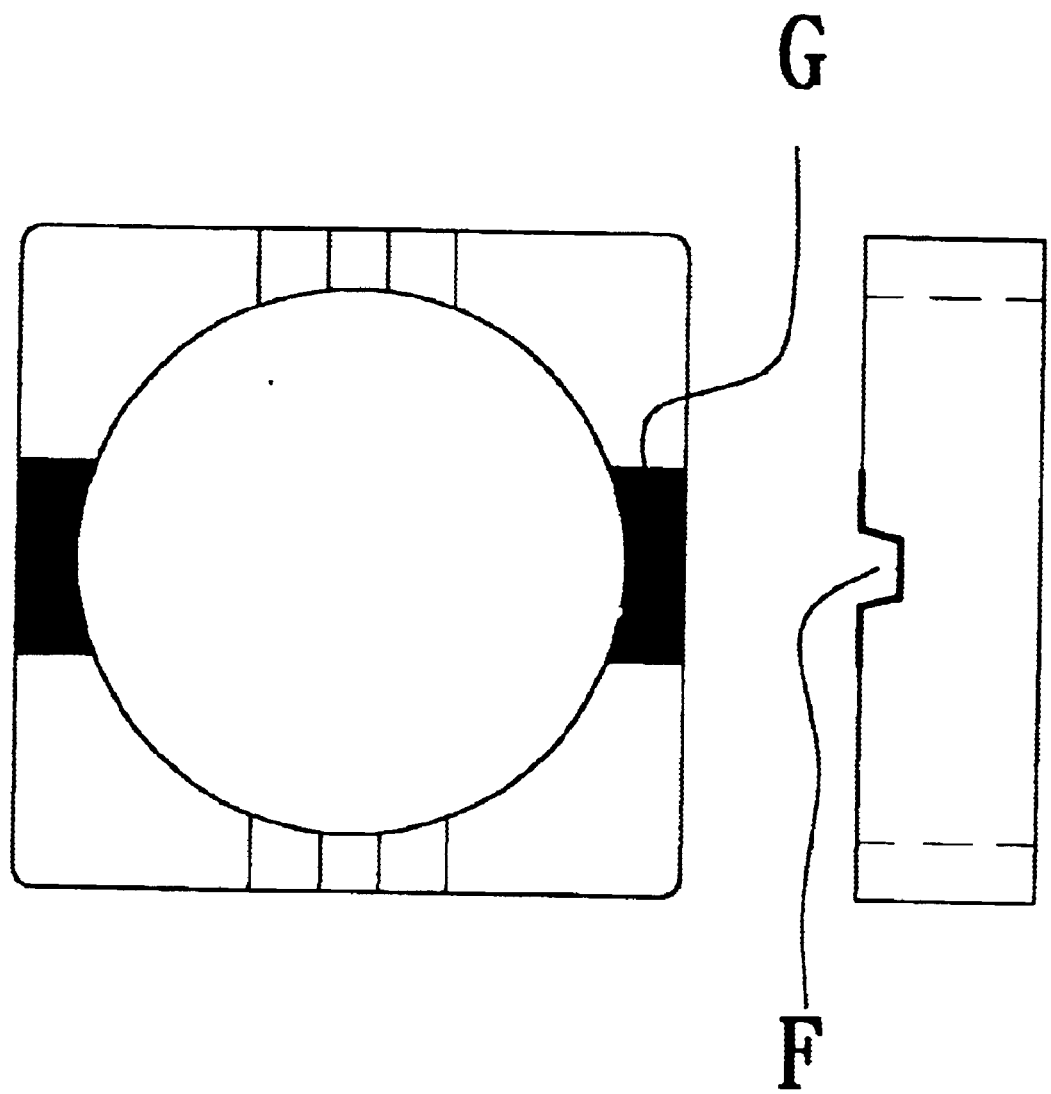
FIG. 2 are top and side views of another structure of electronic component base according to the prior art.
Figure 3:
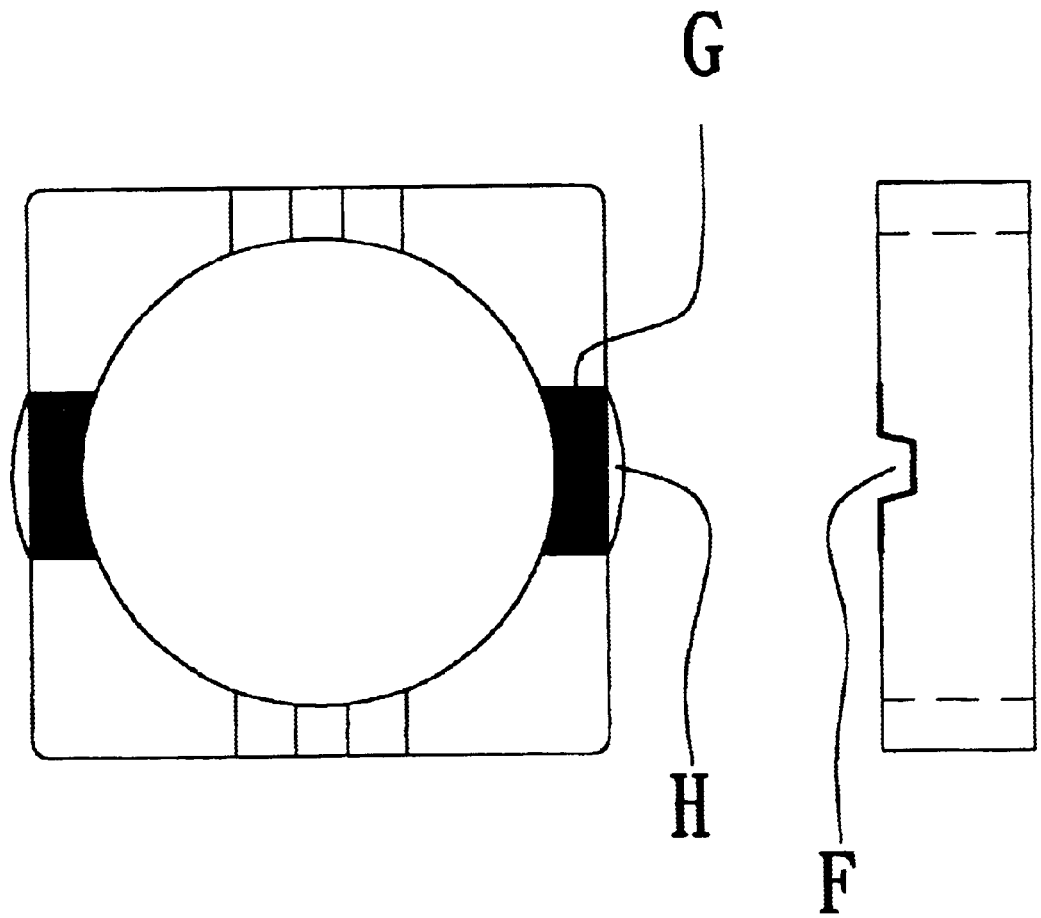
FIG. 3 is similar to FIG. 2 but showing tin solder protruded over the outside of the base.
Figure 4:
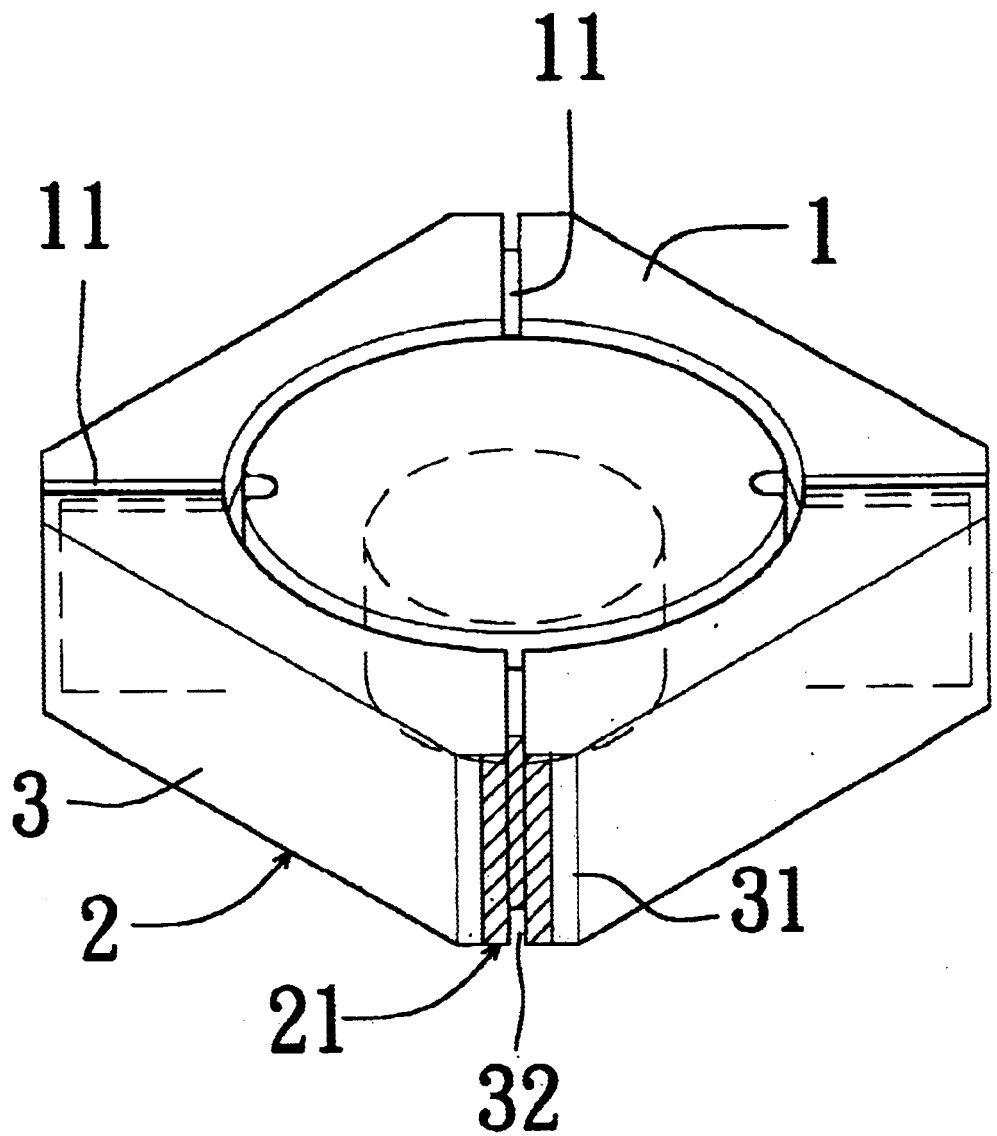
FIG. 4 is a perspective view of an electronic component base according to the present invention.
Figure 5:
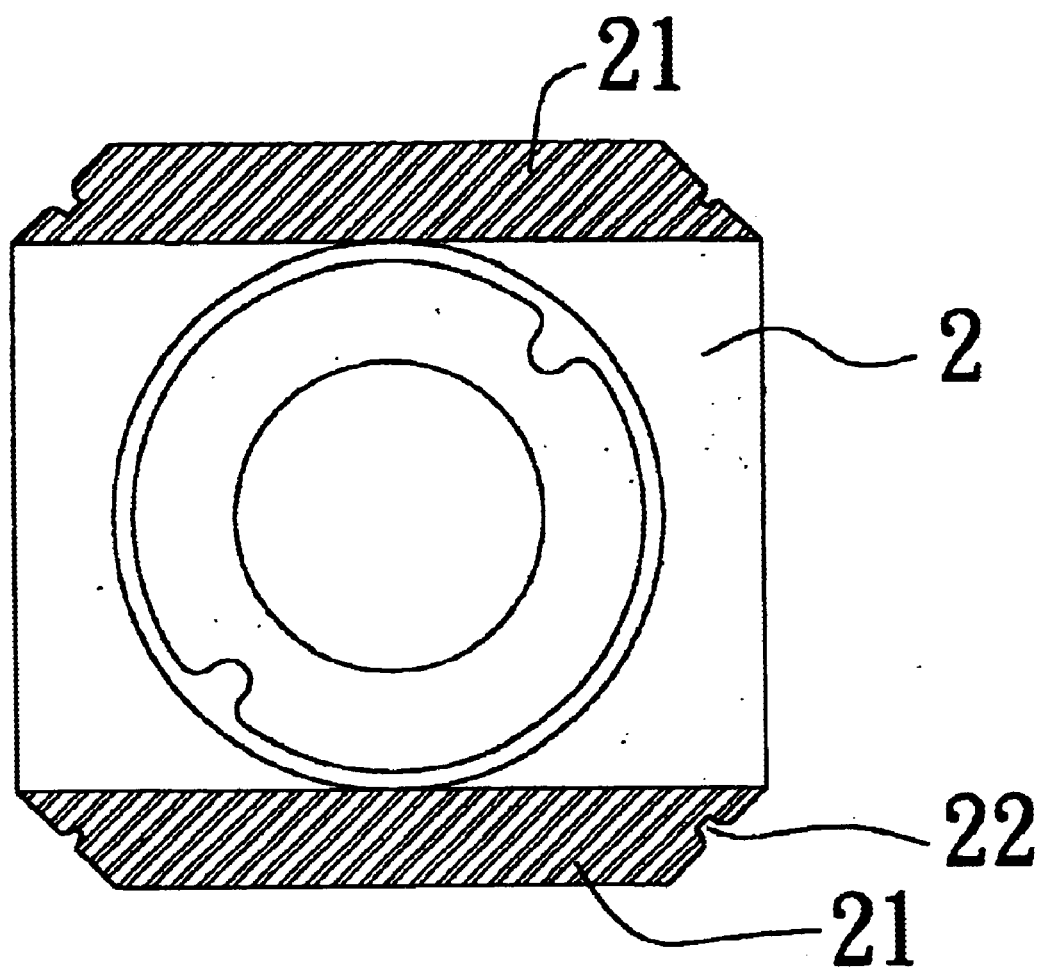
FIG. 5 is a bottom view of the electronic component base according to the present invention.

Referring to FIGS. 4 and 5, an electronic component base is shown having a top wall 1, a bottom wall 2, and four peripheral walls 3 that form the thickness of the electronic component base.

The top wall 1 is adapted to accommodate an electronic component core (not shown), having at least one diagonally extended pair of wire grooves 11 for guiding out metal lead wires. According to the present preferred embodiment, there are two pairs of wire grooves 11 diagonally symmetrically extended in the four corners for guiding out the metal lead wires of two windings (not shown).

The bottom wall 2 fits the top wall 1 in size and shape, having conducting zones 21 formed of metal conducting dots or strips.

The peripheral walls 3 are flat walls connected to one another by chamfered edges 31. Conducting side grooves 32 are respectively formed in the chamfered edges 31 in the four angles between each two adjacent peripheral walls 33, and respectively extended from the wire grooves 11 to the conducting zones 21.

When the electronic component core (not shown) mounted in the top wall 1, the lead wires of the electronic component core are respectively set in the wire grooves 11, and then turned downwards along the side grooves 32 to the conducting zones 21, and then fixedly soldered thereto. Because the four angles in between each two adjacent peripheral walls 3 are chamfered 31, soldering the lead wires of the electronic component core to the conducting side grooves 32 and the conducting zones 21 does not produce protruding solder tin, and therefore the actual specification and size of the electronic component base are maintained within the nominal range. Further, because the lead wires of the electronic component core are soldered to the conducting side grooves 32 and the conducting zones 21 at the periphery of the electronic component base, the top wall 11 is maintained smooth without residual solder tin. By means of the application of different materials, added functions are provided. For example, using soft ferrite greatly increases the inductance value.

A prototype of electronic component base has been constructed with the features of FIGS. 4 and 5. The electronic component base functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An electronic component base for an electronic component comprising:
    a) a top wall having at least one pair of diagonally extending wire grooves;
    b) a bottom wall having a plurality of conducting zones;
    c) four peripheral walls located between the top wall and the bottom wall; and
    d) four chamfered edges, each of the four chamfered edges located between two adjacent peripheral walls and having a conducting side groove connected to and aligning with one of the diagonally extending wire grooves at a first end thereof and connected to one of the plurality of conducting zones at a second end thereof.

2. The electronic component base according to claim 1, wherein the at least one pair of diagonally extending wire grooves includes two pairs of diagonally extending wire grooves.

3. The electronic component base according to claim 1, wherein the plurality of conducting zones are formed with metal conducting dots.

4. The electronic component base according to claim 1, wherein the plurality of conducting zones are formed with metal conducting strips.

* * * * *